United States Patent [19]

Merrill

[11] Patent Number: 5,654,206
[45] Date of Patent: Aug. 5, 1997

[54] AMORPHOUS SILICON LAYER FOR TOP SURFACE OF SEMICONDUCTOR DEVICE

[75] Inventor: Perry Merrill, El Segundo, Calif.

[73] Assignee: International Rectifier Corporation, El Segundo, Calif.

[21] Appl. No.: 636,481

[22] Filed: Apr. 23, 1996

Related U.S. Application Data

[62] Division of Ser. No. 515,702, Aug. 16, 1995, Pat. No. 5,523,604, which is a continuation of Ser. No. 242,316, May 13, 1994, abandoned.

[51] Int. Cl.$^6$ .................. H01L 21/265; H01L 21/20; H01L 21/44; G01R 31/26
[52] U.S. Cl. .................. 438/15; 438/612; 438/17; 438/106
[58] Field of Search .................. 437/8, 31, 40 DM, 437/41 RBP, 41 DM, 101, 189

[56] References Cited

U.S. PATENT DOCUMENTS

| | | |
|---|---|---|
| 4,134,125 | 1/1979 | Adams et al. . |
| 4,319,954 | 3/1982 | White et al. .................. 437/101 |
| 4,523,214 | 6/1985 | Hirose et al. .................. 437/101 |
| 4,697,331 | 10/1987 | Boulitrop et al. .................. 437/101 |
| 4,972,250 | 11/1990 | Omori et al. . |
| 4,984,061 | 1/1991 | Matsumoto . |
| 5,008,725 | 4/1991 | Lidow et al. .................. 357/23.4 |
| 5,029,324 | 7/1991 | Osawa et al. . |
| 5,268,586 | 12/1993 | Mukherjee et al. . |
| 5,288,653 | 2/1994 | Enjoh .................. 437/41 DM |

FOREIGN PATENT DOCUMENTS

| | | |
|---|---|---|
| 0348640 | 1/1990 | European Pat. Off. . |
| 58-51523 | 3/1983 | Japan . |
| 60-100470 | 6/1985 | Japan . |

*Primary Examiner*—John Niebling
*Assistant Examiner*—Brian K. Dutton
*Attorney, Agent, or Firm*—Ostrolenk, Faber, Gerb & Soffen, LLP

[57] ABSTRACT

A layer of amorphous silicon covers the top surface of a semiconductor wafer to act as a moisture and contaminant barrier and to prevent the formation of aluminum hillocks on the aluminum bonding pads for the source and gate electrodes of a power MOSFET or other power semiconductor device. The amorphous silicon is easily penetrated by wire bonding apparatus used to make wire bonds to the conductor pads beneath the amorphous silicon.

3 Claims, 1 Drawing Sheet

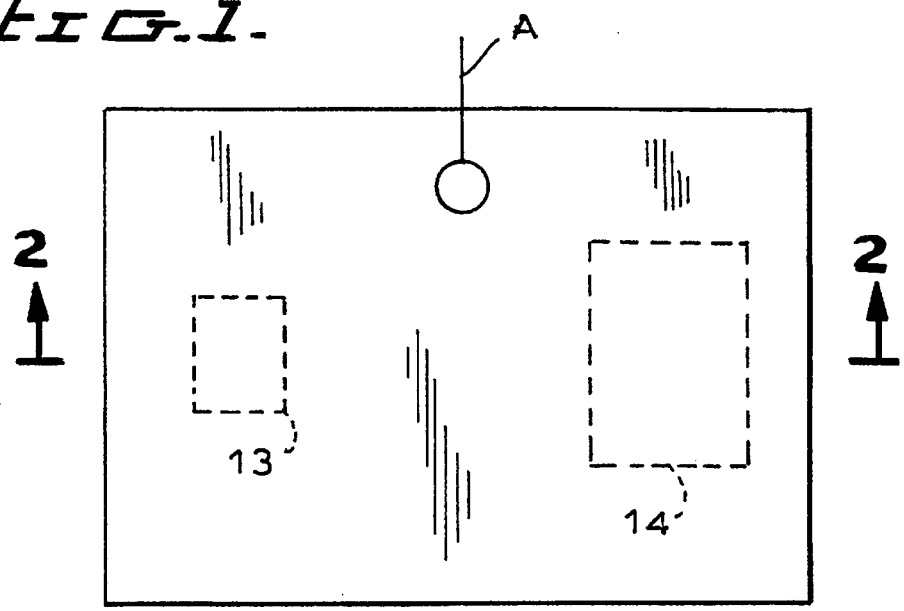
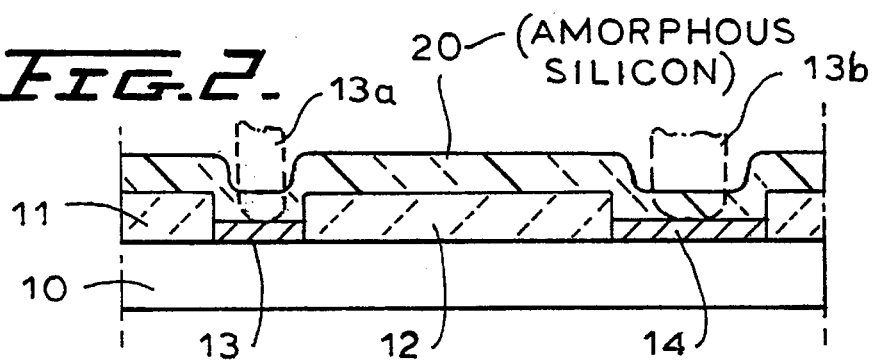
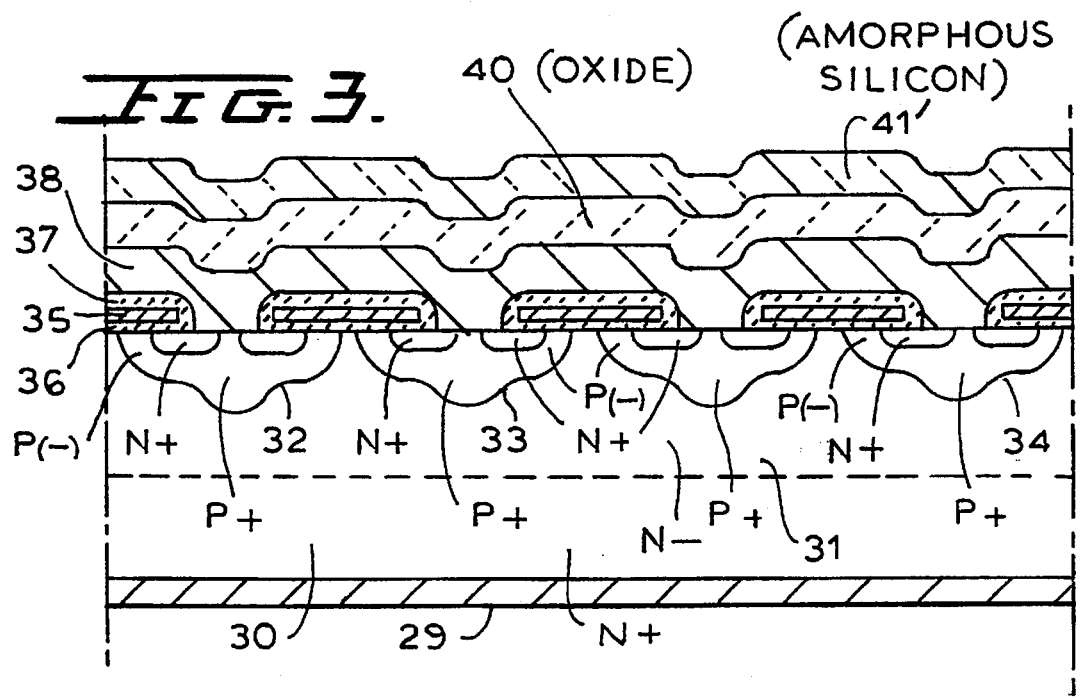

AMORPHOUS SILICON LAYER FOR TOP SURFACE OF SEMICONDUCTOR DEVICE

This is a division of application Ser. No. 08/515,702, filed on Aug. 16, 1995, now U.S. Pat. No. 5,523,604, which is a continuation of application Ser. No. 08/242,316, filed on May 13, 1994, now abandoned.

BACKGROUND OF THE INVENTION

This invention relates to a novel semiconductor device structure in which the top-most layer of the device is a layer of amorphous silicon which overlies the entire semiconductor chip top structure including the bonding pads, but permits wire bonding through the amorphous silicon to underlying aluminum electrode pads.

Semiconductor devices are well known which have P-N junction patterns formed in a silicon chip, with a passivation insulation coating, for example, a deposited oxide, on the upper surface of the chip. Aluminum electrode pads are exposed through the oxide layer for connection to leads such as gate and source leads for a power MOSFET device. Such devices taking the form of an IGBT are shown, for example, in U.S. Pat. No. 5,008,725 and in copending application Ser. No. 08/041,136, filed Mar. 30, 1993, entitled POWER TRANSISTOR DEVICE HAVING ULTRA DEEP INCREASED CONCENTRATION REGION, both assigned to the assignee of the present invention.

A common problem in such devices is that moisture or humidity or other contaminants can penetrate the protective oxides, particularly at high temperatures. Thus, a conventional specification for the "HTRB" (high temperature reverse breakdown) of such devices is that their characteristics should remain stable at 85° C. in a 85% humidity atmosphere. Devices which fail this test cannot be used.

SUMMARY OF THE INVENTION

In accordance with the present invention, a layer of amorphous silicon, having a thickness of 1,100 Angstroms, but in the range of 800 to 3,000 Angstroms, is conventionally deposited over the conventional "scratch" layer, or deposited oxide layer on top of IGBT, power MOSFET, or diode chips, or the like, and over the aluminum or other metal electrode pads which are exposed through openings in the scratch layer. It is also possible to use the present invention advantageously, even for chips which do not have the scratch layer over the patterned aluminum layer.

It has been found, unexpectedly, that conventional wire bonding apparatus can easily bond through the amorphous silicon layer with high reliability. It has been further found, unexpectedly, that the amorphous coating over aluminum pads prevents the formation of "hillocks" on the aluminum surface which is exposed through the scratch layer. Such hillocks reduce the reliability of ultrasonic wire bonds to the aluminum surface. Furthermore, it has been found that die still in the wafer can be easily probed for quality control purposes, and that marking ink will adhere to the surface of the probed die.

Other features and advantages of the present invention will become apparent from the following description of the invention which refers to the accompanying drawings.

BRIEF DESCRIPTION OF THE DRAWINGS

FIG. 1 is a top view of a semiconductor device die which has its top surface covered with amorphous silicon.

FIG. 2 is a cross-sectional view of FIG. 1 taken across section line 2—2 in FIG. 1.

FIG. 3 is a cross-sectional view of a region in the area of circle "A" in FIG. 1 if the device of FIGS. 1 and 2 is a power MOSFET.

DETAILED DESCRIPTION OF THE INVENTION

FIGS. 1 and 2 are drawings of the top and a cross-section, respectively, of any generalized semiconductor device in which one or more P-N junctions extend to the device surface. Such devices are MOS gated devices such as IGBTs, power MOSFETs, thyristors and the like; bipolar transistors; planar diode devices; integrated circuits, and the like, and in which conductive connection pads are provided at the top surface and are adapted to be connected to leads as by wire bonding. Such wire bonds may be made by conventional ultrasonic bonding apparatus or the like.

The device of FIG. 1 comprises a body of monocrystalline silicon 10 which contains any desired junction pattern therein, not shown. It can have any desired dimension, by way of example, a thickness of 20 mils, a length of 4 millimeters and a width of 2 millimeters. The upper surface 11 of the device is passivated by a silicon dioxide, or other insulation material layer 12. Other structures, not shown, may be within layer 12.

The device is shown as having two metal bonding pads 13 and 14, exposed through openings in the oxide layer 12 which conventionally receive ultrasonically bonded leads 13a and 13b. The invention also applies to other lead-forming techniques.

The oxide layer 12 is intended here to represent the top-most protective layer in a prior art device. It is commonly termed a "scratch" layer. It is known that these scratch layers and other layers atop the silicon can sometimes be penetrated by moisture and other contaminants, particularly at high temperatures, causing degrading of the chip or die. However, the invention can be applied to chip structures which do not have the conventional scratch layer.

In accordance with the present invention, a continuous layer of amorphous silicon 20 coats the entire upper surface of the chip of FIGS. 1 and 2 (and coats the entire exposed patterned metallized upper surface of the wafer from which the chip is diced).

It has been found that amorphous silicon forms an impervious barrier to moisture, even at high temperature, thus improving the HTRB characteristics of the device and the yield of the process. Furthermore, it is unnecessary to etch contact openings through the amorphous silicon since conventional ultrasonic wire bonding equipment has been found to bond through the amorphous silicon layer without problems.

Another unexpected benefit of the amorphous silicon over the bonding pads 13 and 14, particularly when they are of aluminum, is that the amorphous silicon prevents the formation of hillocks on the silicon surface which frequently interfere with wire bonding. Such hillocks reduce the reliability of ultrasonic bonds.

As a further feature of the invention, it has been found that the die or chips within the wafer can be wafer probed through the amorphous silicon so that bad die can be identified and marked within the wafer. Further, conventional marking ink adheres well to the amorphous silicon surface.

The amorphous silicon layer 20 can be deposited by well-known processes such as sputtering or evaporation and can be any desired thickness. Since deposition times are short and substrate temperatures are typically less than 300° C., the process does not affect or move junctions in the silicon or otherwise negatively affect the chip.

FIG. 3 shows the invention as applied to a MOS gated type device, a portion of which is shown in cross-section. This portion represents the area of circle "A" of FIG. 1 when the device of FIGS. 1 and 2 is a power MOSFET. Thus, the MOSFET is of the type shown in U.S. Pat. No. 5,008,725 and consists of a thin, flat body of silicon 30 having a thin layer of N(−) silicon epitaxially deposited atop an N+ substrate. A drain contact 29 is connected to the bottom of substrate 30. A plurality of MOSFET cells 32, 33 and 34 (which may have hexagonal topologies when viewed from the top) are diffused into N(−) silicon layer 31, as shown. In an actual die, there can be thousands of such cells formed in a symmetric array.

A polysilicon gate layer 35, having the appearance, from the top, of a symmetrical lattice overlies a gate insulation layer 36, which may be silicon dioxide. The lattice of polysilicon layer 35 is covered and insulated by a deposited oxide layer 37. A patterned aluminum contact metal 38 then overlies the interlayer oxide 37 and contacts the surface of the exposed array of P+ silicon regions at the center of each cell, and the adjacent N+ source rings which surround the P+ central cell surface regions. A layer of silicon dioxide 40, termed a scratch layer, may be deposited over the full upper surface of the chip, and openings are etched in layer 40, as in FIGS. 1 and 2, to expose gate and source metal pads (not shown in FIG. 3).

In accordance with the invention, a layer of amorphous silicon 41 is deposited over the full upper surface area of the chip (and the wafer in which the chip resides during manufacture) to obtain the benefits previously described. Bonding leads 13a and 13b shown in dotted lines in FIG. 2 can penetrate the amorphous silicon layer 20 to contact pads 13 and 14 respectively, and the prior removal of the amorphous silicon in the bonding areas is unnecessary.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for manufacture of a semiconductor device, said process comprising the steps of:

(a) forming at least one p-n junction in a flat chip of semiconductor material;

(b) forming a patterned metallic layer over a surface of said flat chip and in contact with said p-n junction; said patterned metallic layer having a bonding area;

(c) covering the upper surface of said patterned metallic layer with a layer of amorphous silicon; and (d) wire bonding a wire to said bonding area through the amorphous silicon which overlies said bonding area.

2. The process of claim 1, which includes the further step of test probing said flat chip with test probes which extend through said layer of amorphous silicon, without removal of said layer of amorphous silicon at the location of said test probes on said flat chip.

3. A process for manufacture of a semiconductor device, said process comprising the steps of:

(a) forming at least one p-n junction in a flat chip of semiconductor material;

(b) forming a patterned metallic layer over a surface of said flat chip and in contact with said semiconductor material, said patterned metallic layer having a bonding area;

(c) covering the upper surface of said patterned metallic layer with a layer of amorphous silicon; and (d) test probing said flat chip with test probes which extend through said layer of amorphous silicon, without removal of said layer of amorphous silicon at the location of said test probes on said flat chip.

* * * * *